United States Patent
Sleight et al.

(10) Patent No.: US 8,298,881 B2
(45) Date of Patent: Oct. 30, 2012

(54) NANOWIRE FET WITH TRAPEZOID GATE STRUCTURE

(75) Inventors: Jeffrey W. Sleight, Ridgefield, CT (US); Sarunya Bangsaruntip, Mount Kisco, NY (US); Sebastian U. Engelmann, White Plains, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/824,293

(22) Filed: Jun. 28, 2010

(65) Prior Publication Data

US 2011/0315950 A1 Dec. 29, 2011

(51) Int. Cl.
*H01L 21/00* (2006.01)
*H01L 21/84* (2006.01)

(52) U.S. Cl. ........ 438/151; 438/197; 438/163; 257/401; 257/E29.07; 257/E29.135; 257/E29.245; 257/E21.404; 977/938

(58) Field of Classification Search .................. None
See application file for complete search history.

(56) References Cited

U.S. PATENT DOCUMENTS

| | | | |
|---|---|---|---|
| 4,394,182 A | 7/1983 | Maddox, III | |
| 4,671,849 A | 6/1987 | Chen et al. | |
| 4,675,715 A | 6/1987 | Lepselter et al. | |
| 6,531,724 B1 | 3/2003 | Furukawa et al. | |
| 7,898,041 B2 * | 3/2011 | Radosavljevic et al. | 257/401 |
| 2007/0184621 A1 | 8/2007 | Chidambarrao et al. | |
| 2009/0311835 A1 | 12/2009 | Chu et al. | |

* cited by examiner

*Primary Examiner* — Benjamin Sandvik
*Assistant Examiner* — Leslie Pilar Cruz
(74) *Attorney, Agent, or Firm* — Scully, Scott, Murphy & Presser, P.C.; H. Daniel Schnurmann (57) ABSTRACT

In one embodiment, a method of providing a nanowire semiconductor device is provided, in which the gate structure to the nanowire semiconductor device has a trapezoid shape. The method may include forming a trapezoid gate structure surrounding at least a portion of a circumference of a nanowire. The first portion of the trapezoid gate structure that is in direct contact with an upper surface of the nanowire has a first width and a second portion of the trapezoid gate structure that is in direct contact with a lower surface of the nanowire has a second width. The second width of the trapezoid gate structure is greater than the first width of the trapezoid gate structure. The exposed portions of the nanowire that are adjacent to the portion of the nanowire that the trapezoid gate structure is surrounding are then doped to provide source and drain regions.

8 Claims, 5 Drawing Sheets

NANOWIRE FET WITH TRAPEZOID GATE STRUCTURE

BACKGROUND

The present disclosure relates to semiconductor devices and methods of forming semiconductor devices, such as nanowire semiconductor devices.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical.

SUMMARY

In one embodiment, a method of providing a nanowire semiconductor device is provided, in which the gate structure to the nanowire semiconductor device has a trapezoid shape. In one example, the method includes forming a nanowire composed of a semiconductor material, and forming a trapezoid gate structure surrounding at least a portion of a circumference of the nanowire. The first portion of the trapezoid gate structure that is in direct contact with an upper surface of the nanowire has a first width and a second portion of the trapezoid gate structure that is in direct contact with a lower surface of the nanowire has a second width. The second width of the trapezoid gate structure that is in contact with the bottom surface of the nanowire is greater than the first width of the trapezoid gate structure that is in contact with the upper surface of the nanowire. The exposed portions of the nanowire that are adjacent to the portion of the nanowire that the trapezoid gate structure is surrounding are then doped to provide source and drain regions.

In another aspect, a semiconductor device is provided including a nanowire that provides the channel region of the device. In one example, the structure includes a nanowire having a channel region and source and drain extension regions on opposing sides of the channel region. The channel region of the nanowire has a first width on a first surface of the nanowire, and a second width on an opposing second surface of the nanowire, in which the second width is greater than the first width. A trapezoid gate structure is present on the channel region of the nanowire. The sidewall of the trapezoid gate structure is aligned to the first width on the first surface of the nanowire, and the second width on the opposing second surface of the nanowire.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to controlling the proper overlap of the diffusion regions, e.g., source extension region and drain extension region, to the channel region of a nanowire semiconductor device. A semiconductor device is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein, the term "conductivity type" denotes a dopant region being p-type or n-type. A "nanowire semiconductor device" is a semiconductor device in which at least the channel region of the device is present in a nanowire. A "nanowire" is a substantially cylindrical semiconductor material having a circumference that is typically less than 40 nm. As used herein, the "channel region" is the region between the source and drain of a semiconductor device that becomes conductive when the semiconductor device is turned on.

The doping of the diffusion regions, i.e., source and drain extension regions, is particularly challenging in nanowire semiconductor devices, such as nanowire field effect transistors. As used herein a "field effect transistor" is a transistor in which output current, i.e., source-drain current, is controlled by the voltage applied to a gate structure. A field effect transistor has three terminals, i.e, gate structure, source and drain. A nanowire field effect transistor is a device in which the gate structure is present on a channel region that is positioned in a nanowire. The gate structure is a structure used to control output current (i.e. flow of carriers in the channel) of a semiconducting device, such as a nanowire field effect transistor, through electrical or magnetic fields.

In nanowire field effect transistors, the portion of the nanowire that is adjacent to the gate structure typically has a high resistance that results from a low dopant concentration. Typically, the portion of the nanowire region that is immediately adjacent to the gate structure has a dopant concentration that ranges from 1e17 atoms/cm$^3$ to 5e18 atoms/cm$^3$. Prior methods have not been successful in doping this portion of the nanowire to appropriate dopant levels. In one embodiment, the present disclosure provides a method and structure that overcomes the decreased performance that results from the low dopant concentration at the portion of the nanowire that is adjacent to the gate structure.

FIGS. 1-6 depict one embodiment of a nanowire semiconductor structure, and a method of forming a nanowire semiconductor structure, in which a trapezoid gate structure 40 overcomes the deficiencies in nanowire devices having a low dopant concentration nanowire portion adjacent to a gate structure. In some embodiments, the trapezoid gate structure 40 has a greater width at the base of the gate structure than at the upper surface of the gate structure. The trapezoid gate structure 40 effectively provides a longer channel length at the lower surface of the nanowire, and a shorter channel length at the upper surface of the nanowire. The greater width of the trapezoid shaped gate structure at the lower surface of the nanowire serves to turn on the lightly doped, or undoped, source and drain extension regions that are directly adjacent to the gate structure. The shorter width of the trapezoid gate structure 40 at the upper surface of the nanowire functions as a traditional gate structure, and controls the shortest length of the channel. In some embodiments, the trapezoid gate structure 40 reduces the total overall gate capacitance, when compared to gate structures having vertical sidewalls and an upper surface having substantially the same width as the base surface.

Figure 1:
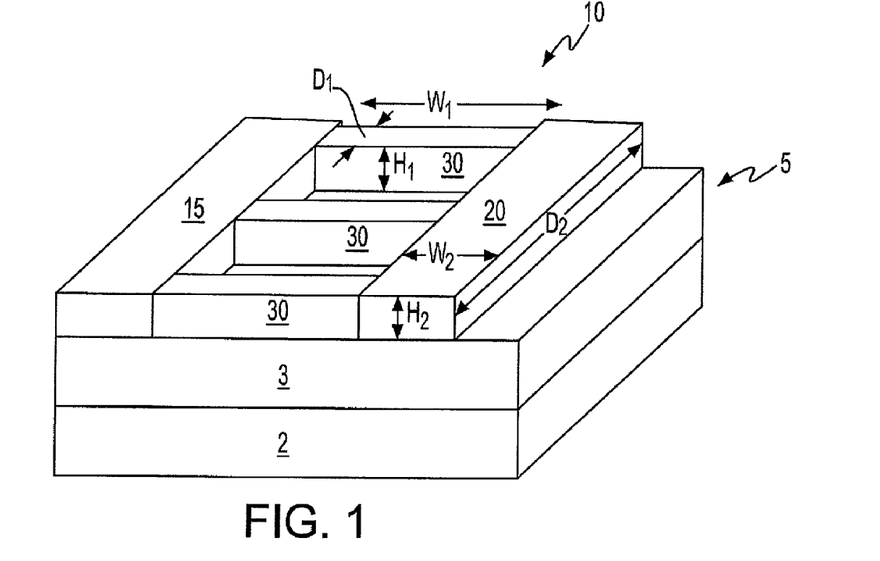
FIG. 1 is a perspective view depicting one embodiment of defining pad portions and a nanowire portion from an SOI layer of a semiconductor on insulator (SOI) substrate, in accordance with a method of forming a nanowire semiconductor device.

Referring to FIG. 1, and in one embodiment, a semiconductor on insulator (SOI) portion 10 is defined, i.e., patterned and etched, from the semiconductor on insulator layer of a semiconductor on insulator (SOI) substrate 5. The SOI portion 10 may include SOI pad regions 15, 20 and a nanowire region 30. The semiconductor on insulator (SOI) substrate 5 includes a first semiconductor layer (hereafter referred to as "semiconductor on insulator (SOI) layer"), that provides the SOI portion 10, a dielectric layer 3 that is underlying the semiconductor on insulator (SOI) layer, and a second semiconductor layer 2 that is under the dielectric layer 3.

The SOI layer that provides the SOI portion 10 may comprise any semiconducting material including, but not limited to, Si, strained Si, SiC, SiGe, SiGeC, Si alloys, Ge, Ge alloys, GaAs, InAs, and InP, or any combination thereof. The SOI layer may be thinned to a desired thickness by planarization, grinding, wet etch, dry etch or any combination thereof. One method of thinning the SOI layer is to oxidize the semiconductor material, such as silicon, by a thermal dry or wet oxidation process, and then wet etch the oxide layer using a hydrofluoric acid mixture. This process can be repeated to achieve the desired thickness.

In one embodiment, the SOI layer has a thickness ranging from 1.0 nm to 20.0 nm. In another embodiment, the SOI layer has a thickness ranging from 2.0 nm to 10.0 nm. In a further embodiment, the SOI layer has a thickness ranging from 3.0 nm to 5.0 nm. An SOI layer having a thickness of less than 10 nm may be referred to as an extremely thin semiconductor on insulator (ETSOI) layer. It is noted that the above thickness for the SOI layer is provided for illustrative purposes only, as other thicknesses for the SOI layer have been contemplated, and may be employed in the present method and structure.

The second semiconductor layer 2 may be a semiconducting material including, but not limited to: Si, strained Si, SiC, SiGe, SiGeC, Si alloys, Ge, Ge alloys, GaAs, InAs, InP as well as other III/V and II/VI compound semiconductors.

The dielectric layer 3 may be an oxide, nitride or oxynitride material. The dielectric layer 3 that may be present underlying the SOI layer and atop the second semiconductor layer 2 may be formed by implanting a high-energy dopant into the SOI substrate 5 and then annealing the structure to form a buried oxide layer, i.e., dielectric layer 3. In another embodiment, the dielectric layer 3 may be deposited or grown prior to the formation of the SOI layer. In yet another embodiment, the SOI substrate 5 may be formed using wafer-bonding techniques, where a bonded wafer pair is formed utilizing glue, adhesive polymer, or direct bonding.

The SOI portion 10 may be formed from the SOI layer using deposition, photolithography and selective etch processes. Specifically, a pattern is produced by applying a photoresist to the surface to be etched, exposing the photoresist to a pattern of radiation, and then developing the pattern into the photoresist utilizing a resist developer. The pattern has the geometry of the desired final structure of the selective etching process. Once the patterning of the photoresist is completed, the sections covered by the photoresist are protected while the exposed regions are removed using a selective etching process that removes the unprotected regions. The photoresist pattern is then transferred into the hard mask material using an etch process, such as a selective etch process, forming the SOI portion 10.

As used herein, the term "selective" in reference to a material removal process denotes that the rate of material removal for a first material is greater than the rate of removal for at least another material of the structure to which the material removal process is being applied. In one embodiment, the selective etch that forms the SOI portions 10 may be selective to the underlying dielectric layer 3 and the photoresist. The etch may be an anisotropic etch.

An anisotropic etch process is a material removal process in which the etch rate in the direction normal to the surface to be etched is greater than in the direction parallel to the surface to be etched. The anisotropic etch may include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from a plasma toward the surface, in which the chemical etching reaction is taking place in the direction normal to the surface. Other examples of anisotropic etching that can be used at this point of the present invention include ion beam etching, plasma etching or laser ablation. Following etching, the photoresist pattern is removed using a selective etch, chemical strip or oxygen ashing.

The nanowire region 30 of the SOI portion 10 is subsequently processed to provide the nanowire of the semiconductor device, in which the channel region is positioned. The nanowire also includes at least a portion of the source and drain extension regions.

In one embodiment, the width of the nanowire region 30 of the SOI portion 10 has a width W1 ranging from 2 nm to 40 nm, a depth D1 ranging from 5 nm to 500 nm, and a height H1 ranging from 2 nm to 40 nm. In another embodiment, the width of the nanowire region 30 of the SOI portion 10 has a width W1 ranging from 5 nm to 15 nm, a depth D1 ranging from 10 nm to 100 nm, and a height H1 ranging from 5 nm to 15 nm.

The pad regions 15, 20 of the SOI portion 10 are subsequently processed to provide at least the contacts to the source and drain regions of the device. In one embodiment, the width W2 of each of the pad regions 15, 20 of the SOI portion 10 ranges from 20 nm to 200 nm, the depth D2 of each of the pad regions 15, 20 ranges from 50 nm to 2000 nm, and the height H2 of each of the pad regions 15, 20 ranges from 5 nm to 200 nm. In another embodiment, the width W2 of each of the pad regions 15, 20 of the SOI portion 10 ranges from 50 nm to 100 nm, the depth D2 of each of the pad regions 15, 20 ranges from 100 nm to 1000 nm, and the height H2 of each of the pad regions 15, 20 ranges from 30 nm to 100 nm.

It is noted that FIG. 1 depicts a patterned SOI portion 10 including three nanowire regions 30 that are in contact with a single set of pad regions 15, 20. It is not intended that the present disclosure be limited thereto, because any number of nanowire regions 30 may be present between the pad regions 15, 20. Further, each nanowire region 30 may have a separate pad region 15, 20 on opposing sides of the nanowire 35.

Figure 2:
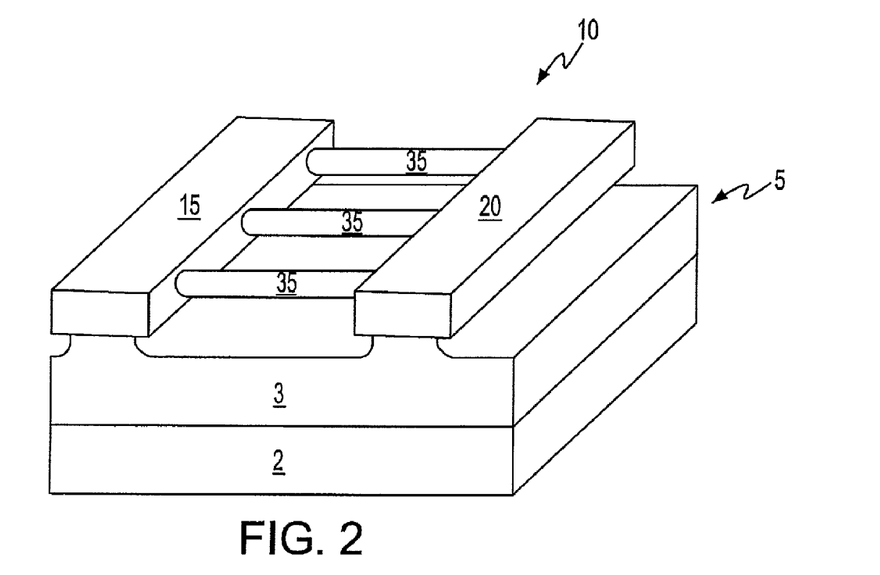
FIG. 2 is a perspective view of smoothing the nanowire portion of the SOI layer to provide a nanowire, in accordance with one embodiment of the present disclosure.

In some embodiments, following the formation of the SOI portion 10, at least a portion of the dielectric layer 3 that is under the nanowire region 30 is removed by an isotropic etching process. In contrast to anisotropic etching, isotropic etching is a form of etching that does not include a preferential direction. One example of an isotropic etch is wet etching. The isotropic etching process forms undercut regions that the subsequently formed nanowires 35 are suspended over, as depicted in FIG. 2. In one example, the isotropic etching of the dielectric layer 3 may be performed using a diluted hydrofluoric acid (DHF). For example, a 100:1 DHF etches 2 mm to 3 nm of dielectric layer 3 per minute at room temperature. It is noted that in some embodiments, the isotropic etch process may be omitted so that the nanowires 35 have a bottom surface that is in direct contact with the upper surface of the dielectric layer 3.

Still referring to FIG. 2, in some embodiments, the nanowire regions are smoothed to form elliptical shaped (and in some cases, cylindrical shaped) nanowires 35. In one embodiment, the smoothing of the nanowire regions may be performed by annealing of the nanowire regions in hydrogen. Example annealing temperatures may range from 600° C. to 1000° C. In one example, the hydrogen pressure of the process to smooth the nanowire regions ranges from 7 ton to 600 torr.

In another embodiment, the reduction of the dimensions of the nanowires 35 may be provided by a high temperature oxidation of the nanowire region followed by etching of the grown oxide. The oxidation and etching process may be repeated to achieve a desired nanowire 35 dimensions. In one embodiment, the diameter of a circular nanowire 35 is less than 40 nm. In another embodiment, the diameter of the circular nanowire 35 ranges from 5 nm to 15 nm. In yet another, embodiment, the diameter of the circular nanowire 35 ranges from 7 nm to 12 nm.

Figure 3A:
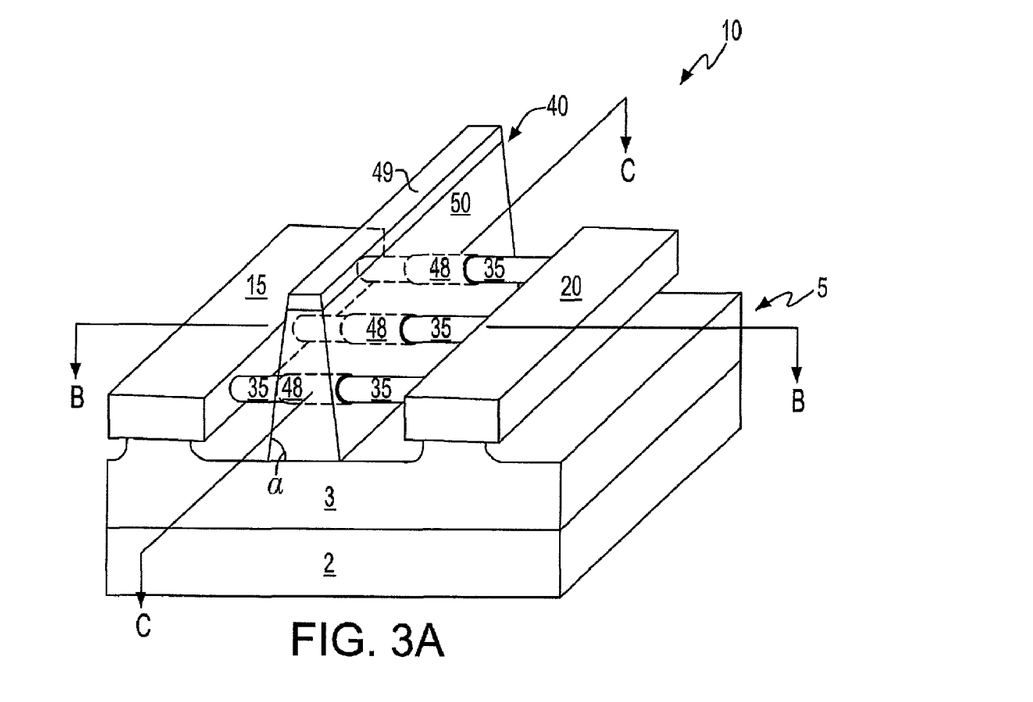
FIG. 3A is a perspective view of forming a trapezoid gate structure in direct contact with at least a portion of the nanowire, in accordance with one embodiment of the present disclosure.
Figure 3B:
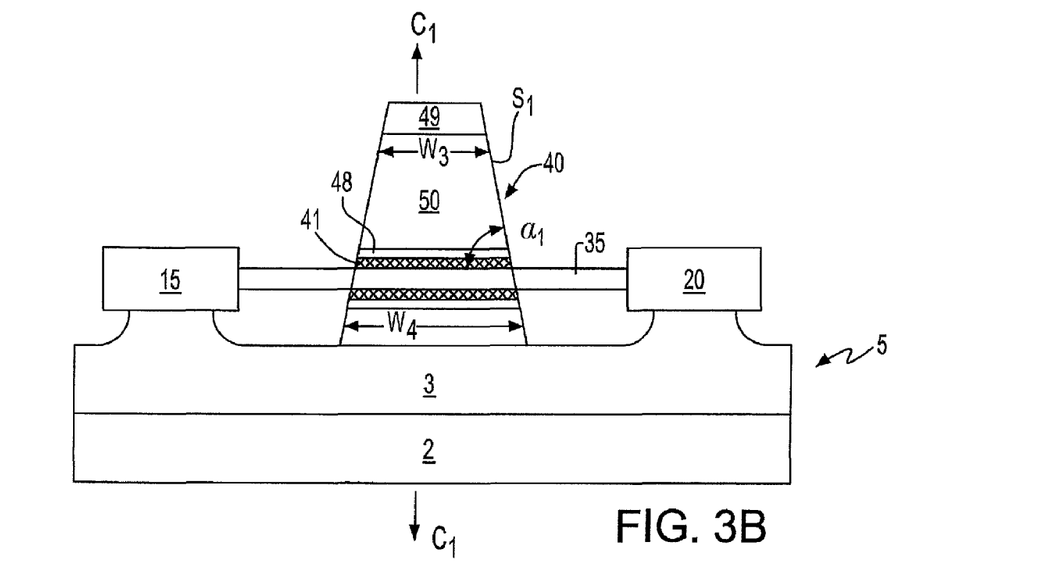
FIG. 3B is a side cross-sectional view of the structure depicted in FIG. 3A along section line B-B.
Figure 3C:
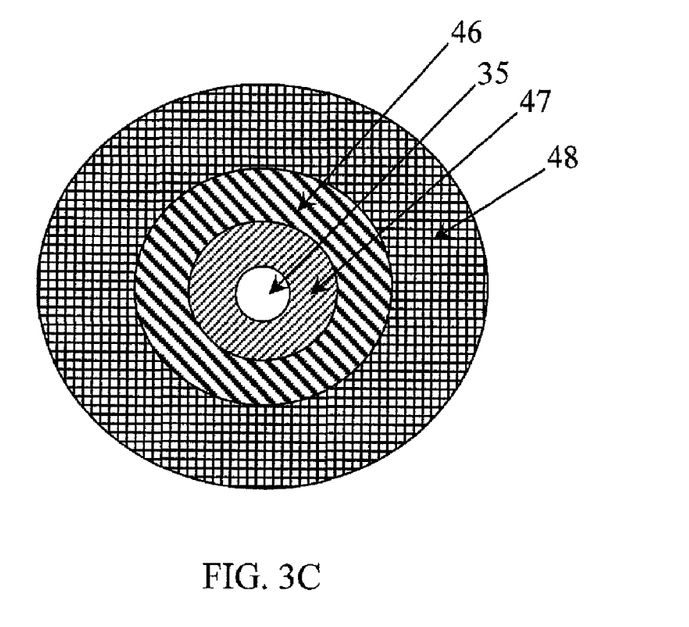
FIG. 3C is a side cross-sectional view of a channel region of the nanowire and the gate dielectric, in which the nanowire is suspended over the dielectric layer of an SOI substrate, as depicted in FIG. 3A along section line C-C.
Figure 3D:
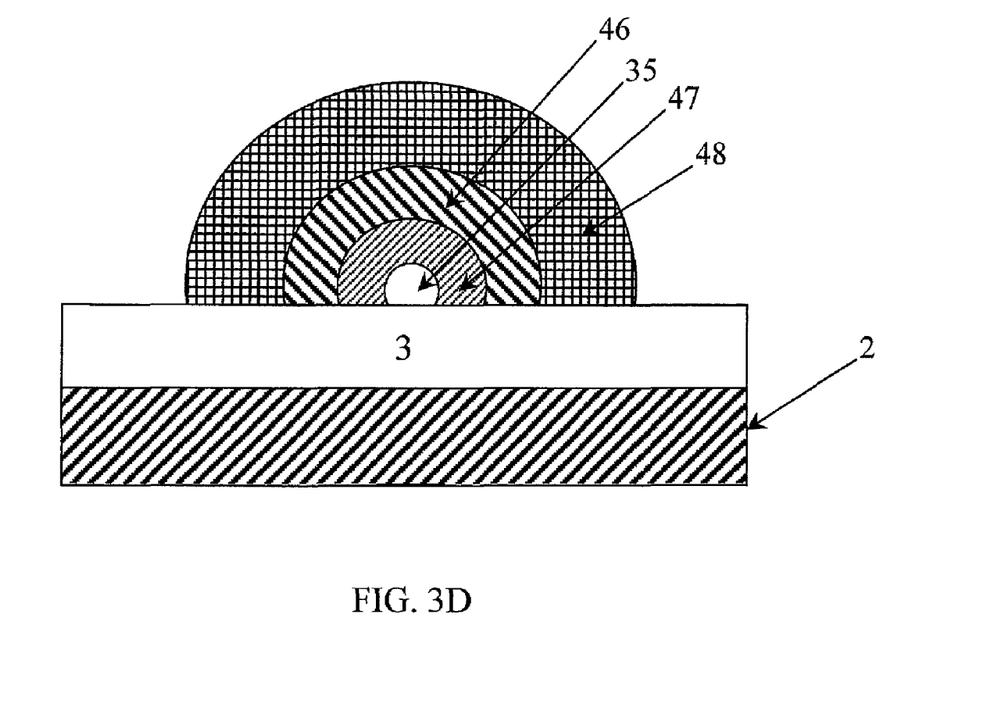
FIG. 3D is a side cross-sectional view of one embodiment of a nanowire and a gate dielectric, in which the nanowire is in direct contact with the dielectric layer of an SOI substrate.

FIGS. 3A-3D depict some embodiments of forming a trapezoid gate structure 40 in direct contact with a portion of the nanowire 35 in which the channel region of the device is present. Each trapezoid gate structure 40 includes at least one gate dielectric and at least one gate conductor 50. Referring to FIGS. 3C and 3D, the at least one gate dielectric typically includes a first gate dielectric layer 46, such as an oxide, e.g., silicon oxide, that is in direct contact with the channel region of the nanowire 35, and a second gate dielectric layer 47, such as a high-k dielectric, e.g., a hafnium containing dielectric, that is in direct contact with the first gate dielectric layer 46. FIG. 3C is a side cross-sectional view of the channel region of the nanowire 35, a gate dielectric composed of a first gate dielectric layer 46 and a second dielectric layer 47, and a metal nitride layer 48 that is present on the second dielectric layer 47. The channel region of the nanowire 35 depicted in FIG. 3C is suspended over an undercut region in the dielectric layer 3 of an SOI substrate 5, as depicted in FIG. 3A. When the trapezoid gate structure 40 fully surrounds the channel region of the nanowire 35, as depicted in FIGS. 3A and 3C, the nanowire semiconductor device is referred to as a gate-all-around (GAA) field effect transistor (FET). Referring to FIG. 3D, when the trapezoid gate structure 40 partially surrounds the channel region of the nanowire 35, as in the case when the nanowire is in direct contact with the dielectric layer 3, the nanowire semiconductor device is referred to an omega-gate field effect transistor.

Referring to FIG. 3A-3C, and in the embodiments in which the nanowires 35 are suspended over the dielectric layer 3, the at least one gate dielectric is formed around the entirety of the circumference, i.e., over and around, of the nanowire 35. Referring to FIG. 3C, the first gate dielectric layer 46 may be an oxide, nitride, or oxynitride material. In some examples, the first gate dielectric layer 46 is a low-k dielectric material. A low-k dielectric material is a dielectric material having a dielectric constant of 4.0 or less, e.g., 4.0, 3.9, 3.8, 3.7 etc. One example of a low-k dielectric material that may be suitable for the first gate dielectric layer 46 is silicon oxide ($SiO_2$). The first dielectric layer 46 may be deposited around the exposed surface of the nanowire 35 by a deposition or thermal growth process. Examples of thermal growth process include oxidation, nitridation or oxynitridation. The first gate dielectric layer 46 may also be formed by a deposition process such as, for example, chemical vapor deposition (CVD). Chemical Vapor Deposition (CVD) is a deposition process in which a deposited species is formed as a results of chemical reaction between gaseous reactants at an elevated temperature (typically being greater than 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others. The thickness of the first gate dielectric layer 46 typically ranges from 2 Å to 100 Å. In another embodiment, the thickness of the first gate dielectric layer 46 ranges from 2 Å to 10 Å.

In the embodiments in which the first gate dielectric layer 46 is a low-k dielectric layer, the second gate dielectric layer 47 is typically a high-k dielectric. A high-k dielectric is a dielectric material having a dielectric constant greater than 4.0, e.g., 4.1, 4.2, 4.3, etc. In one embodiment, the high-k dielectric is comprised of a dielectric material having a dielectric constant greater than 7.0. In yet another embodiment, the high-k dielectric material is comprised of a dielectric material having a dielectric constant ranging from greater than 4.0 to 30. The dielectric constants mentioned herein are relative to a vacuum.

Some examples of high-k dielectric materials suitable for the second gate dielectric layer 47 include, but not limited to hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. The thickness of the second gate dielectric layer 47 typically ranges from 10 Å to 100 Å. In another embodiment, the thickness of the second gate dielectric layer 47 ranges from 15 Å to 50 Å. In one embodiment, the second gate dielectric layer 47 is composed of hafnium oxide ($HfO_2$).

Still referring to FIG. 3C, the metal nitride layer 48 may be formed in direct contact with the second gate dielectric layer 47. In one embodiment, the metal nitride layer 48 is composed of WN, WSiN, TiN, TiSiN, TaN, TaSiN, TiTaN, TaRuN or combinations thereof. The metal nitride layer 48 can be deposited using chemical vapor deposition (CVD), sputtering or plating. In one embodiment, the metal nitride layer 48 is composed of TaN and is deposited using sputtering. In one example, a metal nitride layer 48 composed of TaN is sputtered from a solid tantalum target, in which the nitrogen content of the metal nitride layer is introduced by a nitrogen gas. In another example, a metal nitride layer 48 is composed of TaN is sputtered from a solid target comprised of tantalum and nitrogen. The metal nitride layer 48 typically has a thickness ranging from 1 nm to 10 nm, with a thickness ranging from 2.5 nm to 5 nm being more typical.

Referring to FIGS. 3A and 3B, at least one gate conductor 50 is then deposited over the at least one gate dielectric 41 and the metal nitride layer 48. In FIG. 3B, the at least one dielectric layer identified by reference number 41 includes the first gate dielectric layer and the second gate dielectric layer that are described above with reference to FIG. 3C. The at least one gate conductor 50 may be composed of conductive material including, but not limited to, metals, metal alloys, metal nitrides and metal silicides, as well as laminates thereof and composites thereof. In one embodiment, the at least one gate conductor 50 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The at least one gate conductor 50 may also comprise doped polysilicon and/or polysilicon-germanium alloy materials (i.e., having a dopant concentration from 1E18 to 1E22 dopant atoms per cubic centimeter) and polycide materials (doped polysilicon/metal silicide stack materials). Doping the polysilicon with impurities, such as boron (p-type), or phosphorus (n-type), makes the polysilicon conductive. The at least one gate conductor 50 may be formed using a deposition method including, but not limited to, salicide methods, atomic layer deposition methods, chemical vapor deposition methods and physical vapor deposition methods, such as, but not limited to evaporative methods and sputtering methods.

Once the material layers for the at least one gate dielectric 41, the metal nitride 48, and the at least one gate conductor 50 have been deposited to provide a gate stack on the nanowire 35, the gate stack is then patterned and etched to provide the trapezoid gate structure 40, as depicted in FIG. 3B. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap 49) may be used to form the trapezoid gate structure 40. The dielectric cap 49 may be formed by first depositing a dielectric hard mask material, like SiN or $SiO_2$, atop a layer of the gate conductor material 50 and then applying a photoresist pattern to the hardmask material using a lithography process steps. The photoresist pattern is then transferred into the hard mask material using a dry etch process forming the dielectric cap 49. Next the photoresist pattern is removed and the dielectric cap 49 pattern is then transferred into the gate conductor material during a selective etching process. The dielectric cap 49 may be removed by a wet or dry etch prior to the silicidation process.

The etch process applied to the gate stack provides a trapezoid gate structure 40. The term "trapezoid gate structure" means a gate structure having a side cross-section of a four-sided geometry in which the upper surface, i.e., first side, and the base surface, i.e., second side, are parallel, but the sidewalls, i.e., third and fourth side, are not parallel. Referring to FIG. 3B, in one embodiment, the base surface of the trapezoid gate structure 40 has a greater width, i.e., second width W4, than the upper surface of the trapezoid gate structure 40, i.e., first width W3. The width dimension of the trapezoid gate structure 40 is parallel to the channel length, which is the direction in which the current flows from the source region to the drain region.

In one embodiment, the first width W3 of the trapezoid gate structure 40 ranges from 5 nm to 200 nm, and the second width W4 ranges from 10 nm to 250 nm. In another embodiment, the first width W3 of the trapezoid gate structure 40 ranges from 60 nm to 90 nm, and the second width W4 of the trapezoid gate structure 40 ranges from 70 nm to 100 nm. Typically, the difference between the first width W3 of the trapezoid gate structure 40 and the second width W4 of the gate structure 40 is greater than 10 nm. For example, the difference between the first width W3 of the trapezoid gate structure 40 and the second width W4 of the trapezoid gate structure 40 may range from 10 nm to 50 nm. In another example, the difference between the first width W3 and the second width W4 ranges from 15 nm to 35 nm.

Still referring to FIG. 3B, and in one embodiment, the sidewalls of the trapezoid gate structure 40 are angled. By "angled" it is meant that the angle, i.e., interface angle $\alpha 1$, defined by the interface of the sidewall 51 of the trapezoid gate structure 40 at the upper surface of the nanowire 35 is not equal to ninety degrees. The sidewalls 51 are typically planar. In one embodiment, the interface angle $\alpha 1$ is an acute angle relative to the centerline C1 of the trapezoid gate structure 40. Referring to FIG. 3B, in one embodiment, the interface angle $\alpha 1$ ranges from 45° to 85°. In another embodiment, the interface angle $\alpha 1$ ranges from 55° to 75°. In yet another embodiment, the interface angle $\alpha 1$ ranges from 60° to 70°.

In one embodiment, the trapezoid gate structure 40 is formed using a combination of anisotropic etch, such as reactive ion etch, and an isotropic etch. In a first stage of the etch process, a gate stack composed of the at least one gate dielectric 41, the metal nitride 48, and the at least one gate conductor 50 is etched with an anisotropic etch that is selective to the dielectric cap 49 and the nanowire 35. The anisotropic etch provides an initial gate structure having vertical sidewalls, i.e., sidewalls that are perpendicular to the upper surface of the nanowire 35. In the second stage of the etch, with the dielectric cap 49, i.e., hard mask, still overlying the initial gate structure, the initial gate structure is etched with an isotropic etch to recess the initial gate structure and provide the trapezoid shape while releasing the nanowire 35 in the source and regions of the device. In contrast to anisotropic etching, isotropic etching is a form of etching that does not include a preferential direction. One example of an isotropic etch is an isotropic plasma etch. In some embodiments, the etch rate of the isotropic etch process is the same in all directions. The isotropic etch provides a trapezoid gate structure 40 having an angled sidewall from the initial gate structure having the vertical sidewall, in which the base of the trapezoid gate structure 40 is greater than the upper surface of the trapezoid gate structure 40.

The trapeziodal gate profile is generated during this step by a balance of ion energy and sidewall passivation. The sidewall passivation can be controlled using etch gases employed in semiconductor manufacturing. Typically, the deposition of the material that provides the sidewall passivation is greater on the vertical surfaces of the gate structure, i.e., the sidewall of the gate conductor material 50, then the horizontal surfaces. The deposition of the material that provides the sidewall passivation is sufficiently small on the horizontal surface to enable etching. This can be controlled by the choice of ion energy or gas admixture.

Although not depicted in the supplied figures, in some embodiments, the etch process that forms the trapezoid gate structure 40 is selective to the high-k dielectric material, e.g., $HfO_2$, of the second gate dielectric layer of the at least one gate dielectric 41. In these embodiments, the etch process that forms the trapezoid gate structure 40 stops on the second gate dielectric layer. In the embodiments, in which the second gate dielectric layer has been blanket deposited on the SOI substrate 5, following the etch that provides the trapezoid gate structure 40, a layer of the material of the second gate dielectric layer may be present on the upper surface of the SOI portion 10, and dielectric layer 3 of the SOI substrate 5.

Figure 4A:
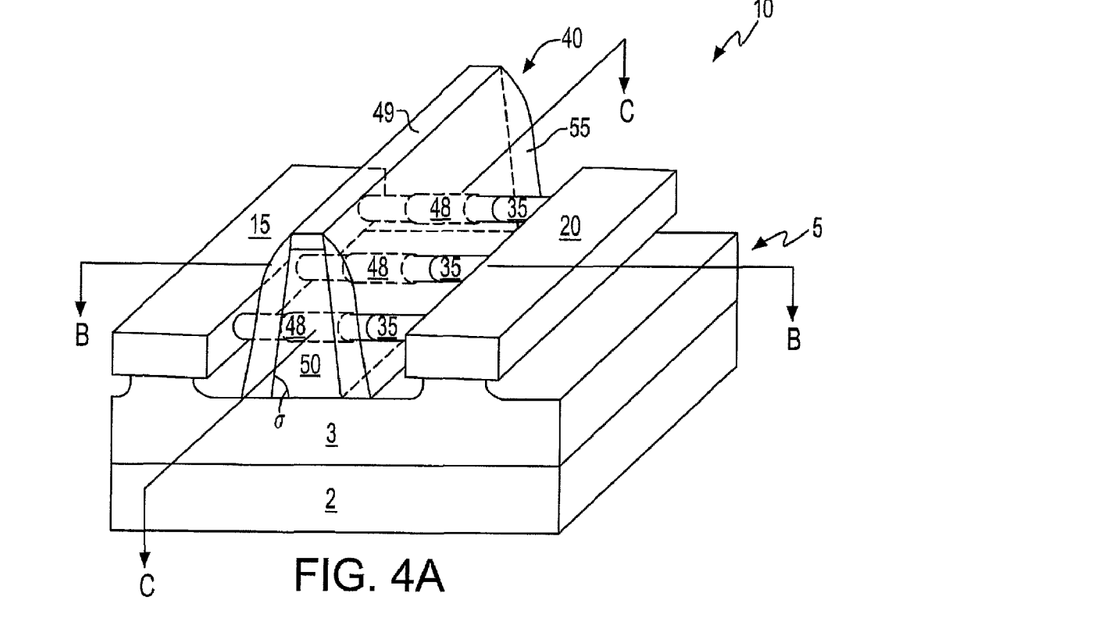
FIG. 4A is a perspective view of forming a spacer along the sidewalls of the trapezoid gate structure depicted in FIG. 3A, in accordance with one embodiment of the present disclosure.
Figure 4B:
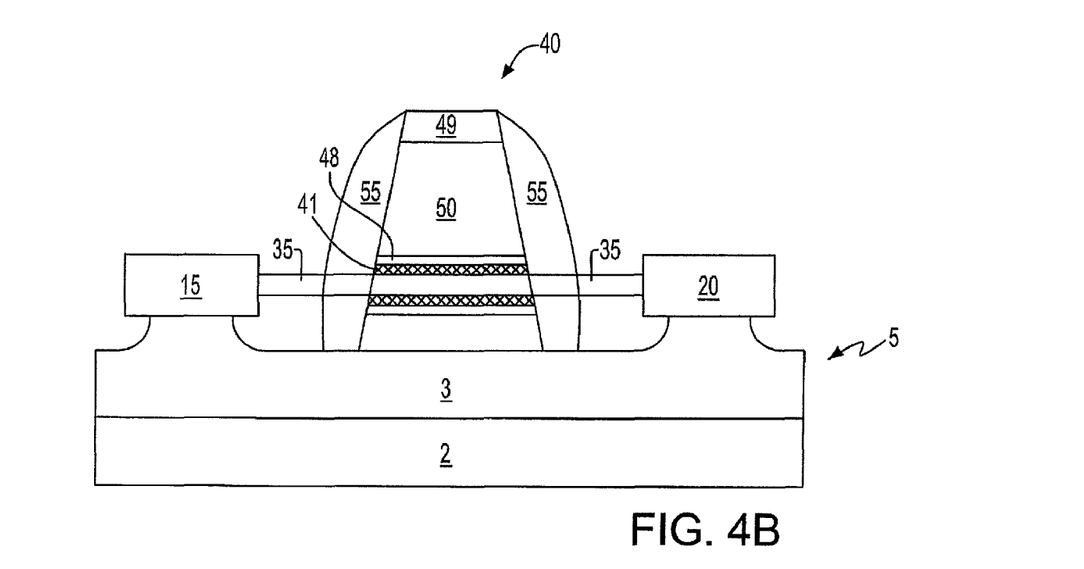
FIG. 4B is a side cross-sectional view of the structure depicted in FIG. 4A along section line B-B.

FIGS. 4A and 4B depict one embodiment of forming sidewall spacers 55 along the sidewalls of the trapezoid gate structure 40. The sidewall spacers 55 are formed by depositing a blanket dielectric film, such as silicon nitride, and etching the dielectric film with an anisotropic etch, such as RIE. In one embodiment, the sidewall spacers 55 are composed of silicon oxide, and have a thickness ranging from 1 nm to 10 nm. The thickness of the sidewall spacers 55 maybe selected to determine the positioning of the dopants, i.e., n-type or p-type dopants, within the nanowire 35 that provide the subsequently formed source and drain extension regions.

In some embodiments, in which the second gate dielectric layer is present on the exposed surfaces of the SOI portion 10 extending from the trapezoid gate structure 40 and is present extending from the sidewall spacers 55, the second gate dielectric layer may be removed using a selective etch process to expose the underlying semiconductor material of the SOI portion 10 and the upper surface of the dielectric layer 3.

Figure 5:
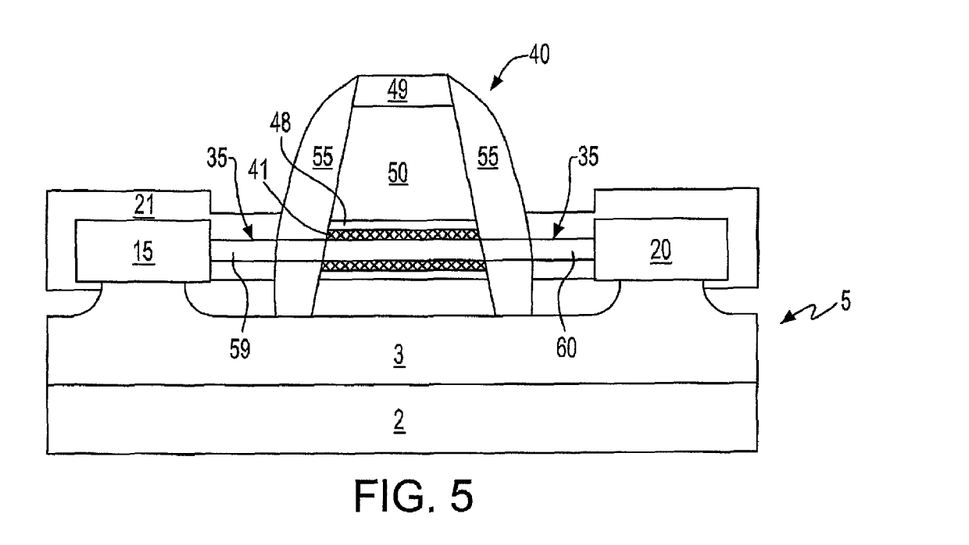
FIG. 5 is a side cross-sectional view depicting doping at least the portions of the nanowire that are adjacent to the trapezoid gate structure, in accordance with one embodiment of the present disclosure.

Referring to FIG. 5, and in some embodiments, following the formation of the sidewall spacers 55, the dopant for the source extension regions 59 and drain extension regions 60 may be introduced to the exposed portion of the nanowire 35 that is adjacent to the sidewall spacers 55. The "drain" is the doped region in nanowire semiconductor device located at the end of the channel region, in which carriers are flowing out of the nanowire semiconductor through the drain. The drain region typically includes a drain extension region 60 and a deep drain region. The term "source" is a doped region in the nanowire semiconductor device, in which majority carriers are flowing into the channel region. The source region typically includes a source extension region 59 and a deep source region. The conductivity type of the dopant that provides the source and drain region of the nanowire semiconductor device determines whether the device is an n-type or p-type nanowire semiconductor device. As used herein, "p-type" refers to the addition of impurities to an intrinsic semiconductor that creates deficiencies of valence electrons. In a silicon-containing nanowire 35, examples of p-type dopants include but are not limited to, boron, aluminum, gallium and indium. As used herein, "n-type" refers to the addition of impurities that contributes free electrons to an intrinsic semiconductor. In a silicon-containing nanowire 35 examples of n-type dopants, i.e., impurities, include but are not limited to, antimony, arsenic and phosphorous.

In one embodiment, source and drain extension regions 59, 60 are formed in each nanowire using an in-situ doped epitaxial growth process followed by an annealing process to drive the dopant from the in-situ doped epitaxial semiconductor material 21 into the nanowire 35 to provide the extension regions. In one embodiment, the in-situ doped semiconductor material 21 is formed using an epitaxial growth process. By "in-situ" doped it is meant that the dopant is incorporated into the in-situ doped semiconductor material 21 during the epitaxial growth process that deposits the semiconductor containing material of the in-situ doped semiconductor material 21. "Epitaxial growth and/or deposition" means the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the nanowire 35 and the SOI pad regions 15, 20 with sufficient energy to move around on the surface and orient themselves to the crystal arrangement of the atoms of the deposition surface. Thus, an epitaxial film deposited on a <111> crystal surface will take on a <111> orientation. If, on the other hand, the wafer surface has an amorphous surface layer, possibly the result of implanting, the depositing atoms have no surface to align to, resulting in the formation of polysilicon instead of single crystal silicon. The epitaxial growth thickens the SOI pad regions 15, 20 and portions of the nanowire 35 that are not covered by the trapezoid gate structure 40 and sidewall spacers 55. The epitaxial growth may merge the adjacent nanowires 35 together with epitaxial silicon.

A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 1000° C. In one embodiment, the in-situ doped semiconductor material 21 may be provided by selective-epitaxial growth of SiGe atop nanowire 35 and the SOI pad regions 15, 20. A precursor for SiGe may be $GeH_4$. The Ge content of the epitaxial grown SiGe may range from 5% to 50%, by atomic weight %. In another embodiment, the Ge content of the epitaxial grown SiGe may range from 10% to 20%. Deposition temperatures for pure Ge deposition may be as low as 300° C. In yet another embodiment, the in-situ doped semiconductor material 21 is composed of epitaxially grown Si:C, i.e., carbon doped silicon. The carbon (C) content of the epitaxial grown Si:C ranges from 0.25% to 5%, by atomic weight %. In another embodiment, the carbon (C) content of the epitaxial grown Si:C may range from 1% to 2.5%.

The in-situ doped semiconductor material 21 is doped with a p-type or an n-type conductivity dopant. P-type dopants are produced in an in-situ doped semiconductor material 21 composed of silicon by elements from group III of the Periodic Table of Elements. In one embodiment, the group III element is boron, aluminum, gallium or indium. In one example, in which the in-situ doped semiconductor material 21 is doped to provide a p-type conductivity, the dopant may be boron present in a concentration ranging from $5 \times 10^{18}$ atoms/$cm^3$ to about $1 \times 10^{20}$ atoms/$cm^3$. Precursors for introducing p-type dopants during the epitaxial growth process for forming the in-situ doped semiconductor material 21 may include $B_2H_6$.

In one embodiment, the in-situ semiconductor material 21 is doped to an n-type conductivity with elements from group V of the Periodic Table of Elements. In one example, in which the in-situ doped semiconductor material 21 is doped to provide an n-type conductivity, the dopant may be arssenic present in a concentration ranging from $5 \times 10^{18}$ atoms/$cm^3$ to about $1 \times 10^{20}$ atoms/$cm^3$. In one embodiment, the group V element is phosphorus, antimony or arsenic. Precursors for introducing n-type dopants during the epitaxial growth process for forming the in-situ doped semiconductor material 21 may include $PH_3$ or $AsH_3$.

The thickness of the in-situ doped semiconductor material 21 may range from 5 nm to 50 nm. In another embodiment, the in-situ doped semiconductor material 21 may range from 10 nm to 30 nm.

Still referring to FIG. 5, the n-type or p-type dopant from the in-situ doped semiconductor material 21 is diffused into the underling portions of the nanowire 35 and the SOI pad regions 15, 20 by an annealing processes including, but not limited to: rapid thermal annealing, furnace annealing, flash lamp annealing or laser annealing. In one embodiment, thermal annealing to diffuse the dopant from the in-situ doped semiconductor material 21 into the nanowire 35 and the SOI pad regions 15, 20 is conducted at a temperature ranging from about 850° C. to about 1350° C.

In one embodiment, in which in-situ doped semiconductor material 21 is doped to a p-type conductivity, the source extension region 59 and the drain extension region 60 that are formed in the nanowire 35 have a p-type conductivity. In another embodiment, in which the in-situ doped semiconductor material 21 is doped to a n-type conductivity, the source extension region 59 and the drain extension region 60 that are formed in the nanowire 35 have an n-type conductivity. Typically, the dopant concentration of the source extension region 59 and the drain extension region 60 having the n-type or p-type conductivity ranges from $5 \times 10^{18}$ atoms/$cm^3$ to $5 \times 10^{20}$ atoms/$cm^3$. In another example, the dopant concentration of the source extension region 59 and the drain extension region 60 having the n-type or p-type conductivity range from $7 \times 10^{19}$ atoms/$cm^3$ to $2 \times 10^{20}$ atoms/$cm^3$.

In other embodiments, instead of providing an in-situ doped semiconductor material 21 to provide the dopant for the source extension region 59 and the drain extension region 60, an epitaxial semiconductor material may be utilized, in which the dopant for the source extension region 59 and the drain extension region 60 is introduced to the epitaxial semiconductor material using ion implantation following the epitaxial growth process. The dopant that is introduced to the epitaxial semiconductor material by ion implantation may then be diffused into the underlying nanowire 35 using a thermal anneal, as described above for the in-situ doped semiconductor material 21. In yet another embodiment, the dopant for the source extension region 59 and the drain extension region 60 may be directly introduced to the nanowire 35 by ion implantation or gas phase doping. In this embodiment, the epitaxial semiconductor layer may be omitted.

Figure 6:
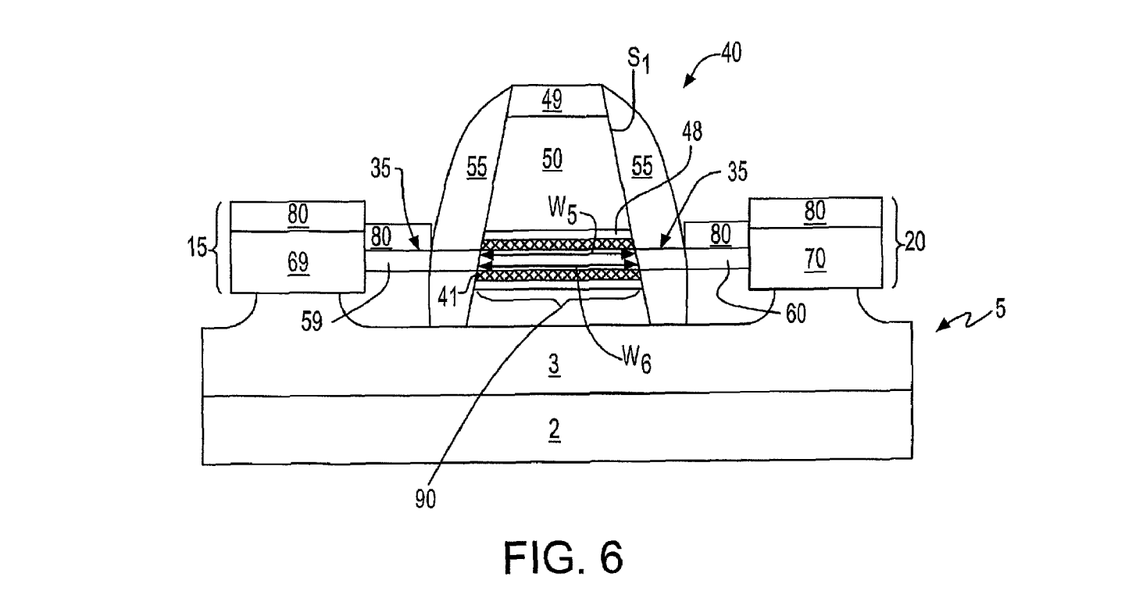
FIG. 6 is a side cross-sectional view depicting forming deep source and drain regions and metal semiconductor alloy contacts, in accordance with one embodiment of the present disclosure.

FIG. 6 depicts forming a deep source region 69 and deep drain region 70 in the SOI pad regions 15, 20. The deep source region 69 and the deep drain region 70 may be formed using ion implantation. During the ion implant that provides the deep source region 69 and the deep drain region 70, the portions of the device in which the implant is not desirable may be protected by a block mask, such as a photoresist block mask. The deep source and drain regions 69, 70 have the same conductivity dopant as the source extension region 59, and the drain extension region 60, but the deep source and drain regions 69, 70 typically have a greater dopant concentration then the source and drain extension regions 59, 60.

FIG. 6 further depicts forming a metal semiconductor alloy 80, such as a silicide, on the upper surface of the SOI pad regions 15, 20 that contain the deep source and drain regions 69, 70. Silicide formation typically requires depositing a refractory metal such as Ni or Ti onto the surface of a Si-containing material. Following deposition, the structure is subjected to an annealing step using conventional processes such as, but not limited to, rapid thermal annealing. During thermal annealing, the deposited metal reacts with Si forming a metal silicide. Following the formation of the metal semiconductor alloy 80, back end of the line (BEOL) processing may be employed to provide connectivity to the device.

The structure depicted in FIG. 6 includes a nanowire 35 comprising a channel region and source and drain extension regions 59, 60 on opposing sides of the channel region 90, wherein the channel region 90 has a first width W5 on an first surface of the nanowire 35 and a second width W6 on an opposing second surface of the nanowire 35. Typically, the second surface of the nanowire 35 is the bottom surface of the nanowire 35, and the first surface of the nanowire 35 is the top surface of the nanowire 35. The second width W6 is greater than the first width W5.

In one embodiment, the first width W5 of the nanowire 35 ranges from 70 nm to 90 nm, and the second width W6 of the nanowire ranges from 80 nm to 100 nm. Typically, the difference between the first width W5 of the nanowire 35 and the second width W6 of the nanowire 35 is greater than 10 nm. For example, the difference between the first width W5 of the nanowire 35 and the second width W6 of the nanowire may range from 10 nm to 50 nm. In another example, the difference between the first width W5 and the second width W6 of the nanowire ranges from 15 nm to 35 nm.

A trapezoid gate structure 40 is present on the channel region 90 of the nanowire 35, wherein the sidewall S1 of the trapezoid gate structure is aligned to the first width W5 on the first surface of the nanowire 35, and the second width W6 on the opposing second surface of the nanowire 35. By "aligned to" it is meant that the sidewall S1 of the trapezoid gate structure 40 that is in direct contact with the first surface of the nanowire 35 is in contact with the end of the first width W5 of the channel region 90, and is in contact with the second width W6 of the channel region 90 on the second surface of the nanowire 35.

The trapezoid gate structure 40 effectively provides a longer channel length at the lower surface of the nanowire 35, and a shorter channel length at the upper surface of the nanowire 35. The greater width of the trapezoid gate structure 40 at the lower surface of the nanowire 35 serves to turn on the lightly doped, or undoped, source and drain extension regions 59, 60 that are directly adjacent to the trapezoid gate structure 40. Typically, the lightly doped or undoped source and drain extension regions 59, 60 that are directly adjacent to the trapezoid gate structure 59, 60 have a dopant concentration that ranges from 5e18 atom/cm$^3$ to 1e20 atoms/cm$^3$. The shorter width of the trapezoid gate structure 40 at the upper surface of the nanowire 35 functions as a traditional gate structure, and controls the shortest length of the channel region 90. In some embodiments, the trapezoid shaped gate structure 40 reduces the total overall gate capacitance. For example, when compared to a gate structure having vertical sidewalls and an upper surface with substantially the same width as the base surface of the gate structure, a trapezoid gate structure with a difference in the width of the upper surface to the base surface of the gate structure being on the order of 40 nm provides a decrease in overall gate capacitance equal to approximately 20% of the gate capacitance of the gate structure having the vertical sidewalls.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    forming a nanowire comprised of a semiconductor material;
    forming a trapezoid gate structure surrounding at least a portion of a circumference of the nanowire, wherein a first portion of the trapezoid gate structure that is in direct contact with an upper surface of the nanowire has a first width and a second portion of the trapezoid gate structure that is in direct contact with a lower surface of the nanowire has a second width, the second width being greater than the first width; and
    doping an exposed portion of the nanowire adjacent the portion of the circumference of the nanowire that the trapezoid gate structure is surrounding, wherein the doping provides source and drain dopant regions.

2. The method of claim 1, wherein the forming of the nanowire comprises:
    providing a semiconductor layer on a dielectric layer;
    etching the semiconductor layer to provide a nanostructure;
    etching the dielectric layer to provide an undercut region under a portion of the nanostructure, wherein the nanostructure is suspended over the undercut region;
    annealing the nanostructure to form an elliptical cross section, wherein the nanostructure having the elliptical cross section is the nanowire.

3. The method of claim 2, wherein the semiconductor layer on the dielectric layer is provided by a semiconductor on insulator (SOI) substrate.

4. The method of claim 2, wherein the nanostructure comprises pad sections on opposing sides of a portion of the nanostructure that provides the nanowire.

5. The method of claim 4, wherein the doping of the exposed portion of the nanowire comprises epitaxially growing a semiconductor material on the pad sections adjacent to the nanowire, wherein the semiconductor material is doped with an p-type or n-type dopant, and diffusing the dopant from the semiconductor material into the pad sections and the exposed portion of the nanowire.

6. The method of claim 1, wherein the trapezoid gate structure comprises an upper surface having a greater width than a base surface of the trapezoid gate structure, wherein sidewalls of the trapezoid gate structure are angled.

7. The method of claim 1, wherein the forming of the trapezoid gate structure comprises forming at least one gate dielectric layer the portion of the circumference of the nanowire, forming at least one gate conductor layer on the at least one gate dielectric layer, and forming at least one dielectric cap layer on the at least one gate conductor layer to provide a gate stack; forming a first etch mask on the gate stack; etching the gate stack selective to the first etch mask.

8. The method of claim 1, wherein the doping of the exposed portion of the nanowire comprises ion implantation of an n-type or p-type dopant.

* * * * *